United States Patent [19]
Ishikawa

[11] Patent Number: 5,463,592
[45] Date of Patent: Oct. 31, 1995

[54] DYNAMIC RANDOM ACCESS MEMORY DEVICE HAVING WORD LINE INTERMITTENTLY DRIVEN TO ACTIVE LEVEL

[75] Inventor: Toru Ishikawa, Tokyo, Japan

[73] Assignee: NEC Corporation, Tokyo, Japan

[21] Appl. No.: 98,796

[22] Filed: Jul. 29, 1993

[30] Foreign Application Priority Data

Jul. 29, 1992 [JP] Japan ................................. 4-201685

[51] Int. Cl.[6] ................................. G11C 8/00; G11C 7/00
[52] U.S. Cl. ................................. 365/230.06; 365/189.11; 365/226
[58] Field of Search ................................. 365/230.06, 226, 365/189.11

[56] References Cited

U.S. PATENT DOCUMENTS 4,503,522  3/1985  Etoh et al. ........................ 365/189.11
5,056,062  10/1991  Kuwabara et al. ................. 365/189.11
5,103,113  4/1992  Inui et al. ........................... 365/226
5,257,232  10/1993  Dhong et al. ........................ 365/226

OTHER PUBLICATIONS

"CMOS Device Handbook", published by Nikkan Industry Newspaper Corporation with spot translation.

*Primary Examiner*—David C. Nelms
*Assistant Examiner*—Son Dinh
*Attorney, Agent, or Firm*—Sughrue, Mion, Zinn, Macpeak & Seas

[57] ABSTRACT

A word line driver incorporated in a dynamic/random access memory device drives a word line over a power voltage level with a first pulse signal until development of potential differences indicative of data bits on bit line pairs and with a second pulse signal before restoring the data bits into memory cells, and the word line is maintained in a low voltage level between the first and second pulse signals so as to save electric power consumption.

1 Claim, 5 Drawing Sheets

DYNAMIC RANDOM ACCESS MEMORY DEVICE HAVING WORD LINE INTERMITTENTLY DRIVEN TO ACTIVE LEVEL

FIELD OF THE INVENTION

This invention relates to a dynamic random access memory device and, more particularly, to a dynamic random access memory device operative in a page mode of operation.

DESCRIPTION OF THE RELATED ART

Figure 1:
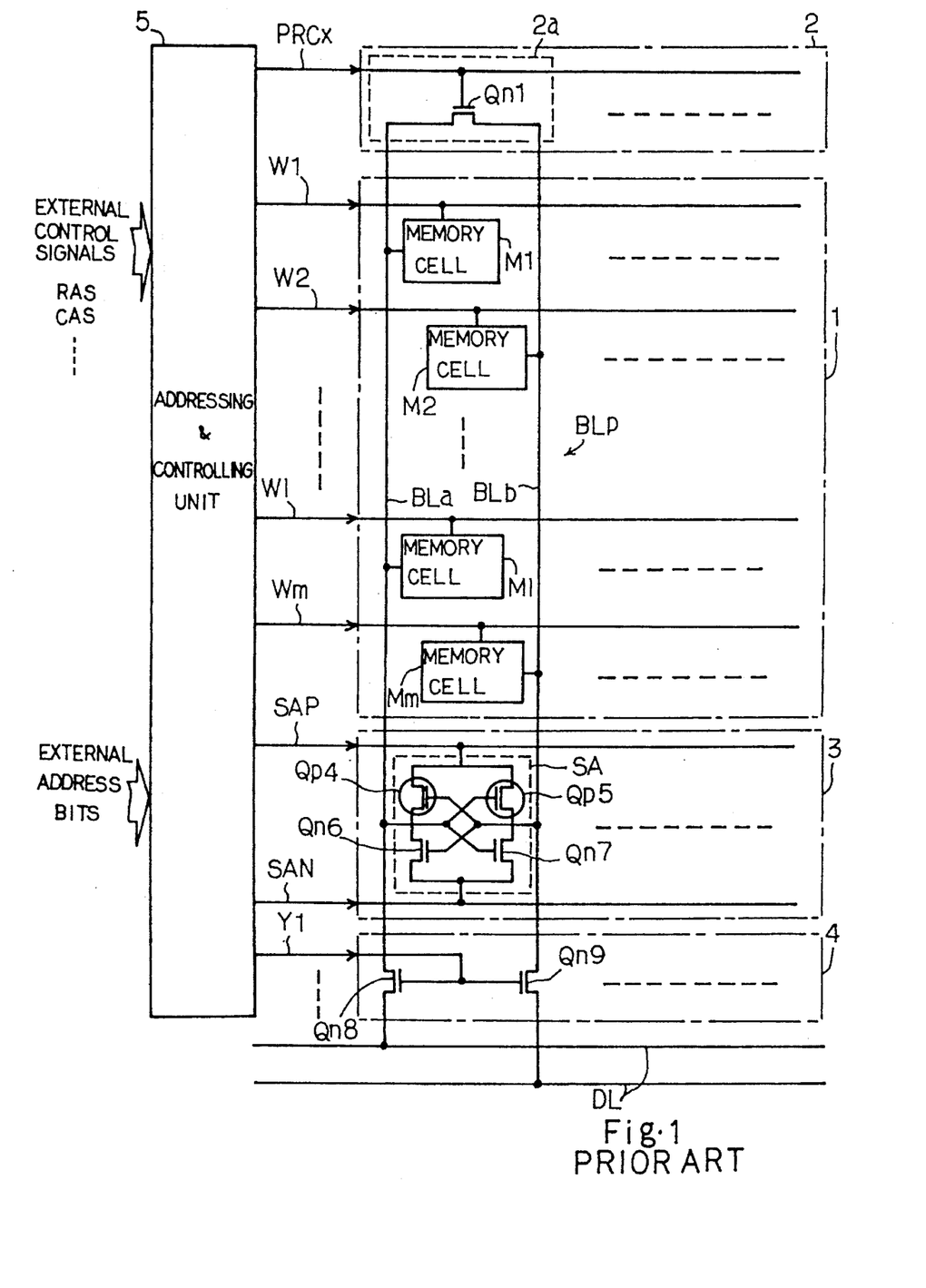
FIG. 1 is a block diagram showing the circuit arrangement of the prior art dynamic random access memory device.

A typical example of the dynamic random access memory device is illustrated in FIG. 1 of the drawings, and comprises a memory cell array 1 implemented by a plurality of memory cells arranged in rows and columns. However, only one column of memory cells M1, M2, Ml and Mm is illustrated in FIG. 1 for the sake of simplicity. The memory cells M1 to Mm are of the dynamic type implemented by a series combination of an n-channel enhancement type switching transistor and a storage capacitor, and a data bit is stored in the storage capacitor in the form of electric charge.

The memory cell array 1 is associated with a plurality of bit line pairs, and each bit line pair is shared between a column of memory cells. For example, bit lines BLa and BLb are associated with the column of memory cells M1 to Mm, and are paired with one another for forming one of the bit line pairs BLP. The memory cells M1 to Mm are alternately coupled with the bit lines BLa and BLb, and either bit line BLa or BLb is conducted through the n-channel enhancement type switching transistor with the storage capacitor of one of the memory cells M1 to Mm.

The prior art dynamic random access memory device further comprises a precharging/balancing unit 2, and the precharging/balancing unit 2 is constituted by a plurality of precharge/balancing circuits 2a respectively associated with the columns of memory cells. Each of the precharging/balancing circuits 2 is implemented by an n-channel enhancement type balancing transistor Qn1 coupled between the bit lines BLa and BLb. The n-channel enhancement type balancing transistors Qn1 are gated by a precharge control signal line PRCx, and the precharge control signal line PRCx goes up to an active power voltage level Vcc when activated. While the precharge control signal line PRCx is staying in the active power voltage level Vcc, the n-channel enhancement type balancing transistors Qn1 are simultaneously turned on, and the bit lines BLa and BLb are balanced at the mid point Vcc/2 between a positive power voltage level Vcc and the ground voltage level.

The prior art dynamic random access memory device further comprises a plurality of word lines W1, W2, Wl and Wm, and the word lines W1 to Wm are respectively associated with the rows of memory cells. The n-channel enhancement type switching transistors of the memory cells M1 to Mm are respectively coupled with the word lines W1 to Wm, and the word lines W1 to Wm are selectively driven over the positive power voltage level Vcc so that the n-channel enhancement type switching transistor conducts the associated storage capacitor with either bit line BLa or BLb. Then, a data bit stored therein is read out from the storage capacitor of the selected memory cells in each column to the associated bit line BLa or BLb, and the bit line BLa or BLb slightly goes up or down depending upon the logic level of the data bit stored therein.

The prior art dynamic random access memory device further comprises a sense amplifier unit 3, and the sense amplifier unit 3 is implemented by an array of sense amplifier circuits SA. The sense amplifier circuit SA has two complementary inverters coupled between high and low power lines SAP and SAN, i.e., two series combinations of p-channel enhancement type switching transistors Qp4/Qp5 and n-channel enhancement type switching transistors Qn6/Qn7, and the input node of one of the complementary inverters is coupled with the output node of the other complementary inverter. The input nodes and, accordingly, the output nodes of the complementary inverters are respectively coupled with the bit lines BLa and BLb, the sense amplifier circuit SA increases the potential difference on the associated bit line pair when the power lines SAP and SAN are separated to the positive power voltage level Vcc and the ground voltage level.

The prior art dynamic random access memory device further comprises a column selecting unit 4, and the column selecting unit 4 has a plurality sets of n-channel enhancement type transfer transistors Qn8 and Qn9 coupled between the bit line pairs and a data bus DL. The plurality pairs of n-channel enhancement type transfer transistors Qn8 and Qn9 are selectively gated by column address decoded signal lines, and the column address decoded signal line Y1 is coupled with the gate electrodes of the n-channel enhancement type transfer transistors Qn8 and Qn9 associated with the bit line pair BLP. While the pair of n-channel enhancement type transfer transistors Qn8 and Qp9 are turned on, the bit line pair BLP is conducted with the data bus DL, and potential difference is transferred between the bit line pair BLP and the data bus DL.

The prior art dynamic random access memory device further comprises an addressing/ controlling system 5 responsive to external address bits and external control signals, and the addressing/ controlling system 5 sequentially drives the precharge control signal line PRCx, one of the word lines W1 to Wm, the power lines SAP and SAN and one of the column signal decoded lines. In other words, a write-in sequence and a read-out sequence are selectively carried out under the control of the addressing/controlling system. The external address bits contain row address bits and column address bits, and two external control signal lines are known as a row address strobe signal RAS and a column address strobe signal CAS. The row address bits are latched in the addressing/controlling system in synchronism with the row address strobe signal RAS, and the column address bits are repeatedly latched in synchronism with the column address strobe signal CAS in a high-speed page mode.

Although other components such as an input/output data buffer, a write amplifier and a read amplifier are further incorporated in the prior art dynamic random access memory device, no further description is made on these components, because they are less important for understanding a problem inherent in the prior art dynamic random access memory device.

Figure 2:
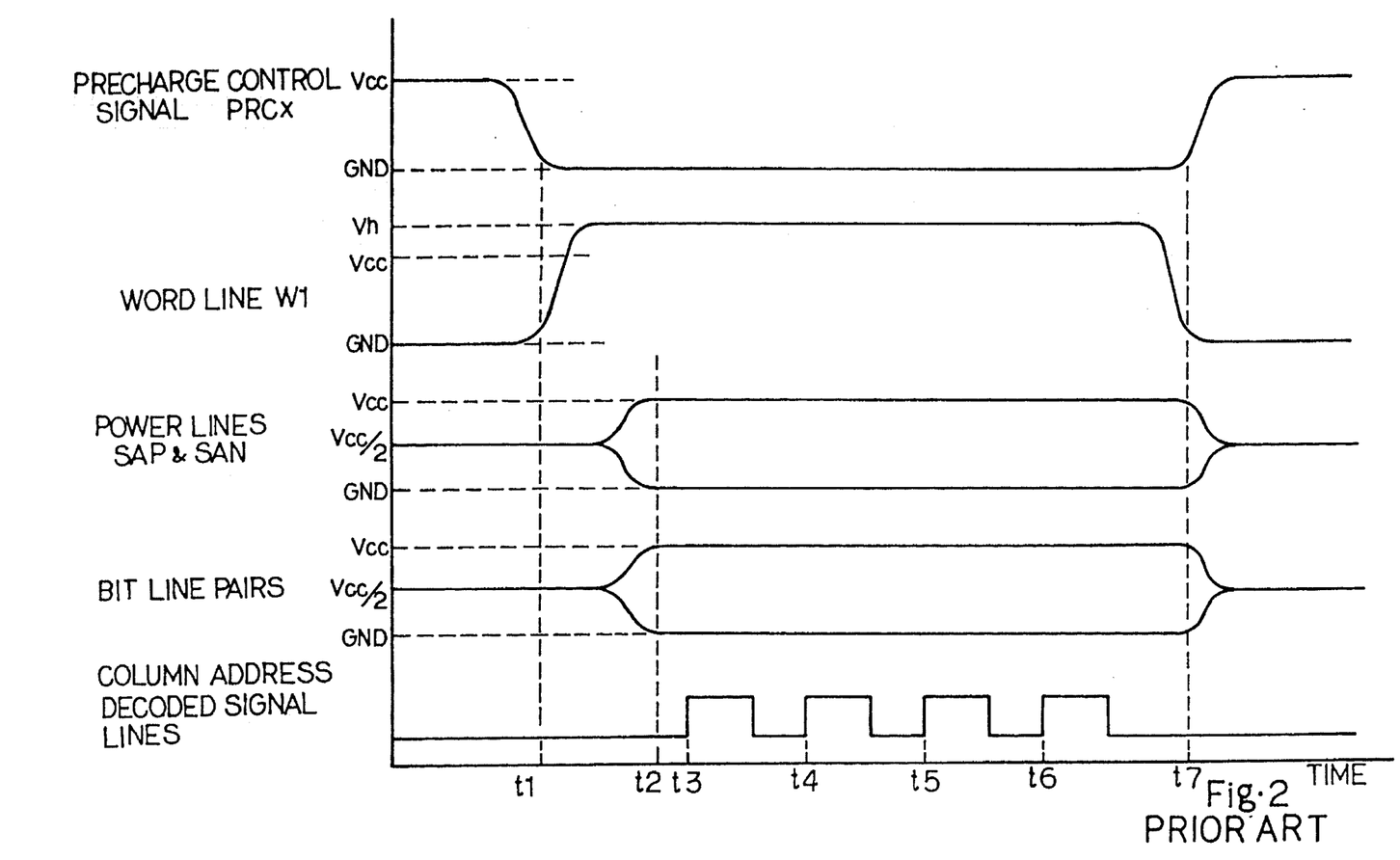
FIG. 2 is a timing chart showing the read-out sequence in the page mode.

Turning to FIG. 2 of the drawings, a read-out sequence in the high-speed page mode starts with completion of a precharging. Namely, the precharge control signal PRCx is recovered from the positive power voltage level Vcc to the ground voltage level at time t1, and the bit lines BLa and BLb are electrically isolated from the positive power voltage line Vcc as well as from each other.

The row address bits are latched by the addressing/ controlling system 5 in synchronism with the row address strobe signal RAS, and the addressing/controlling system 5 starts boosting the word line W1 over the positive power voltage level Vcc, by way of example, at time t1. Then, the n-channel enhancement type switching transistors of the memory cells coupled with the word line W1 concurrently turn on, and the associated storage capacitors are respectively conducted with the bit lines BLa of the respective bit line pairs. Though not shown in FIG. 2, while the word line W1 is maintained in the boosted voltage level Vh, small potential differences take place on the bit line pairs, and the small potential differences are propagated to the array of sense amplifier circuits SA.

The addressing/controlling system 5 allows the power lines SAP and SAN to start separating from the mid level Vcc/2, and the power supply lines SAP and SAN reach the positive power voltage level Vcc and the ground voltage level at time t2. Then, and the sense amplifier circuits SA concurrently increase the potential differences on the associated bit line pairs, respectively, and the bit lines of each pair also start separating from the mid level Vcc/2. As a result, the sense amplifier circuits SA keep the potential differences respectively indicative of the data bits read out from the memory cells coupled with the selected word line W1.

The column address strobe signal CAS swings between high and low voltage levels four times, and the column address bits changes the column address in synchronism with the column address strobe signal CAS. The addressing/controlling system 5 is responsive to the column address bits, and sequentially changes the column address decoded signal lines to the active high voltage level at times t3, t4, t5, t6 and t7. Then, the column selector unit 4 sequentially conducts the four bit line pairs with the data bus D1 at intervals, and the potential differences on the selected four bit line pairs are sequentially supplied to the read amplifier (not shown). Thus, the four read-out data bits are sequentially delivered from the prior art dynamic random access memory device to a destination with repetition of the precharging.

Finally, the precharge control signal line PRCx goes up to the power voltage level Vcc, and the n-channel enhancement type balance transistors Qn3 concurrently turn on for balancing the bit line pairs at the mid level Vcc/2. The word line WL1 is concurrently recovered from the boosted voltage level to the ground voltage level, and the power lines SAP and SAN are regulated to the mid level Vcc/2 again.

Thus, the read-out data bits are sequentially transferred to the read amplifier in the high-speed page mode, and the high-speed page mode shrinks an access time per bit. A problem is encountered in the prior art dynamic random access memory device in the number of data bits sequentially read out during a single read-out sequence in the high-speed page mode. This is because of the fact that the addressing/controlling system 5 can not maintain the word line at the boosted voltage level Vh over a predetermined time period. Namely, while the selected word line is maintained at the boosted voltage level Vh, the electric power consumption is drastically increased, and the time period from t1 to time t7 is maximized at 100 microseconds. The time period between time t1 to time t7 thus limited merely allows the addressing/controlling system 5 to repeat the address latch predetermined times.

Even if the time period is prolonged without increase of the electric power consumption, the boosted voltage level on the selected word line tends to deteriorate associated circuit components such as the n-channel enhancement type switching transistors incorporated in the memory cells, and the prior art dynamic random access memory device with the prolonged time period is less reliable.

SUMMARY OF THE INVENTION

It is therefore an important object of the present invention to provide a dynamic random access memory device which allows column selection to be increasable in a single read-out sequence in a page mode without sacrifice of reliability.

To accomplish the object, the present invention proposes to intermittently drive a selected word line twice.

In accordance with the present invention, there is provided a dynamic random access memory device fabricated on a semiconductor chip, comprising: a) a memory cell array implemented by a plurality of addressable memory cells for respectively storing data bits in the form of electric charge; b) a plurality of bit line pairs selectively coupled with the plurality of addressable memory cells; c) a plurality of word lines selectively coupled with the plurality of addressable memory cells, and selectively driven for coupling selected addressable memory cells of the memory cell array with the plurality of bit line pairs; d) a sensing means coupled with the plurality of bit line pairs, and responsive to a first internal control signal at a first timing for increasing potential differences indicative of data bits on the bit line pairs; e) a precharging means coupled with the plurality of bit line pairs, and responsive to a second internal control signal at a second timing after the first timing for canceling the potential difference on the plurality of bit line pairs; and f) an addressing and controlling means coupled with the plurality of word lines, the sensing means and the precharging means, and operative to drive the word lines the addressing and controlling means selectively driving the word lines to a first active level for a first time period containing the first timing and to a second active level for a second time period before the second timing, all of the plurality of word lines being maintained in an inactive level between the first time period and the second time period.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 3:
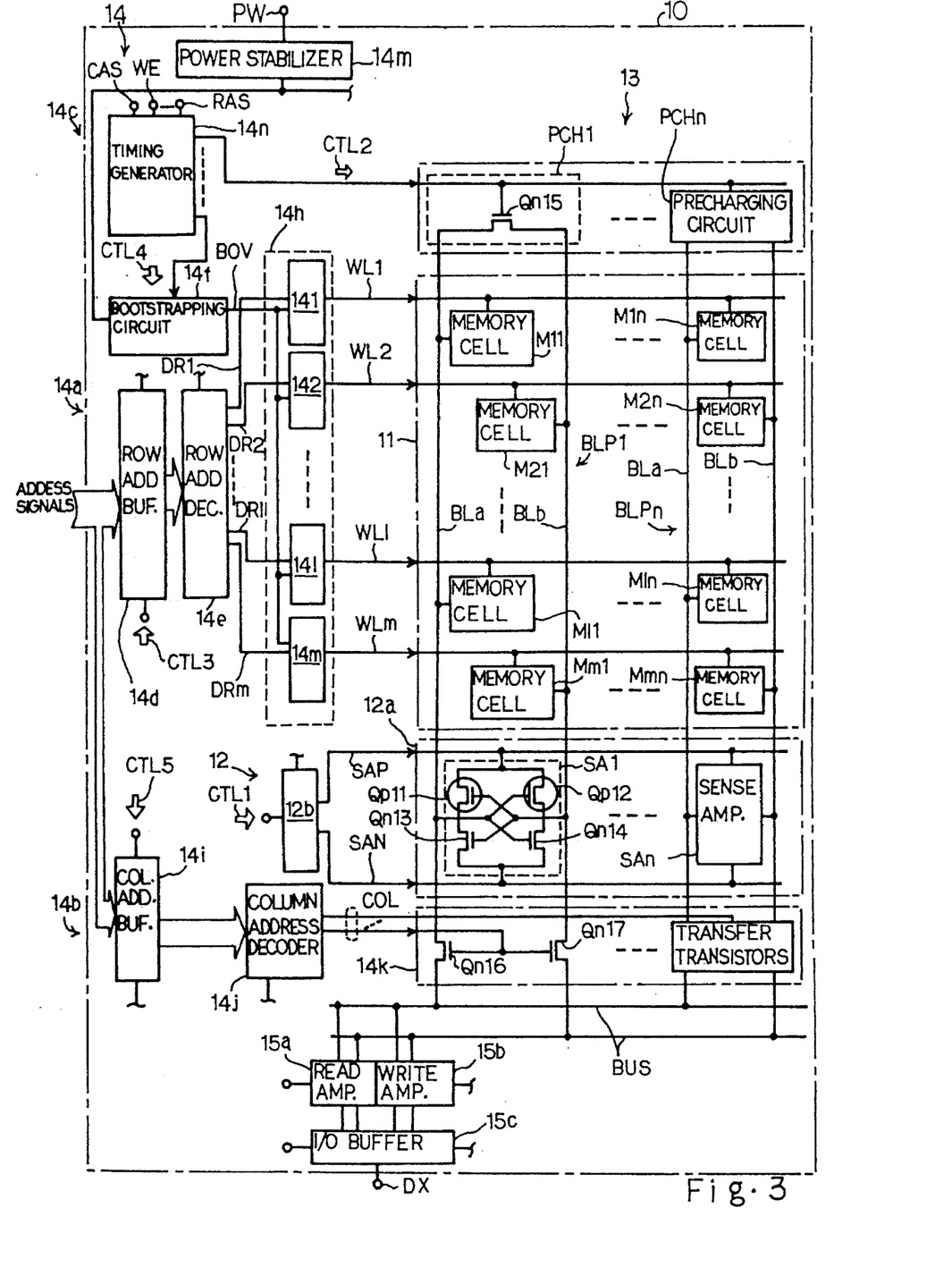
FIG. 3 is a block diagram showing the circuit arrangement of a dynamic random access memory device according to the present invention.

Referring to FIG. 3 of the drawings, a dynamic random access memory device embodying the present invention is fabricated on a single semiconductor chip 10, and largely comprises a memory cell array 11, a plurality of word lines WL1, WL2, ..., WLl and WLm, a plurality of bit line pairs BLP1 to BLPn, a sensing system 12, a precharging system 13 and an addressing and controlling system 14.

The memory cell array 11 is constituted by a plurality of memory cells M11, M1n, M21, M2n, Ml1, Mln, Mm1 and Mmn, and the plurality of memory cells M11 to Mmn are arranged in rows and columns. Each of the memory cells M11 to Mmn is implemented by a series combination of an n-channel enhancement type switching transistor and a storage capacitor (not shown), and a data bit is stored in each storage capacitor in the form of electric charge.

The plurality of bit line pairs are provided in association with the columns of memory cells M11 to Mmn, respectively, and each bit line pair consists of left and right bit lines BLa and BLb. The n-channel enhancement type switching transistors of the memory cells in each column are alternately coupled with the left and right bit lines BLa and BLb of the associated bit line pair. Column addresses are assigned to the columns of memory cells and, accordingly, to the bit line pairs BLP1 to BLPn, respectively.

The plurality of word lines WL1 to WLm are respectively associated with the rows of memory cells M11 to Mmn, and each word line is coupled with the gate electrodes of the n-channel enhancement type switching transistors in the associated row. The word lines WL1 to WLm are selectively driven over a positive power voltage level Vcc so that the storage capacitors of the associated memory cells are conducted through the n-channel enhancement type switching transistors with the left or right bit lines BLa or BLb. Then, potential differences take place on the plurality of bit line pairs BLP1 to BLPn, respectively. Row addresses are assigned to the rows of memory cells and, accordingly, to the word lines WL1 to WLm, respectively.

The sensing system comprises a sense amplifier unit 12a and a driver unit 12b. The sense amplifier unit 12a is constituted by a plurality of sense amplifier circuits SA1 to SAn coupled in parallel between power supply lines SAP and SAN, and the plurality of sense amplifier circuits SA1 to SAn are respectively associated with the plurality of bit line pairs BLP1 to BLPn for increasing the potential differences thereon.

Each of the sense amplifier circuits SA1 to SAn is implemented by two complementary inverters, i.e., two series combinations of p-channel enhancement type switching transistors Qp11/Qp12 and n-channel enhancement type switching transistors Qn13/Qn14, and the input node of one of the complementary inverters is coupled with the output node of the other complementary inverter. The left and right bit lines BLa and BLb of each bit line pair are coupled with the input nodes and, accordingly, the output nodes of the complementary inverters.

The sense amplifier circuits SA1 to SAn thus arranged increase the potential differences on the bit line pairs BLP1 to BLPn when the driver unit 12b supplies the positive power voltage level Vcc and the ground voltage level to the power supply lines SAP and SAN, respectively. As will be described hereinlater, the driver unit 12b is responsive to an internal control signal CTL1 for driving the power supply lines SAP and SAN to the positive power voltage level and the ground voltage level. The internal control signal CTL1 serves as a first timing control signal.

The precharging system 13 comprises a plurality of precharging circuits PCH1 to PCHn, and the plurality of precharging circuits PCH1 to PCHn are respectively associated with the bit line pairs BLP1 to BLPn for balancing the left and right bit lines BLa and BLb of the associated bit line pair. The plurality of precharging circuits PCH1 to PCHn are identical in circuit arrangement with one another, and each of the precharging circuits PCH1 to PCHn is implemented by an n-channel enhancement type balancing transistor Qn15 coupled between the left and right bit lines BLa and BLb of the associated bit line pair. An internal control signal CTL2 is supplied to the gate electrodes of the n-channel enhancement type balancing transistors Qn15, and the n-channel enhancement type balancing transistors Qn15 concurrently turn on for canceling the potential differences, thereby balancing the left and right bit lines BLa and BLb at the mid voltage level Vcc/2. The internal control signal CTL2 serves as a second internal timing control signal.

The addressing and controlling system 14 is broken down into a row addressing sub-system 14a, a column addressing sub-system 14b and a timing controlling sub-system 14c.

The row addressing sub-system 14a comprises a row address buffer unit 14d coupled with address pins (not shown), a row address decoder unit 14e, a bootstrapping circuit 14f, and a word line driver unit 14h. The row address buffer unit 14d is responsive to an internal control signal CTL3 produced in synchronism with a row address strobe signal RAS supplied from the outside thereof, and latches an external row address signal indicative of one of the row addresses. The row address buffer unit 14d produces row address predecoded signals also indicative of the row address, and the row address predecoded signals are supplied to the row address decoder unit 14e. The row address decoder unit 14e discriminates the row address indicated by the row address predecoded signals, and drives one of the row address decoded signal lines DR1, DR2, DRl and DRm to the power voltage level Vcc.

The bootstrapping circuit 14f is responsive to a boot control signal CTL4 of the power voltage level Vcc, and produces a boosted voltage signal BOV having a high level over the power voltage level Vcc and a low level equal to the ground level. The boot control signal CTL4 is generated in a one-shot pulse form, and, accordingly, the boosted voltage signal BOV is also produced in a one-shot pulse form. The bootstrapping phenomenon and the circuit arrangement are well known to a person skilled in the art, and, for this reason, no further description is incorporated hereinbelow for the sake of simplicity.

The word line driver unit 14h is constituted by a plurality of driver circuits 141, 142, 14l and 14m, and the plurality of driver circuits 141 to 14m are respectively associated with the word lines WL1 to WLm. The driver circuits 141 to 14m are coupled between the output voltage line of the bootstrapping circuit 14f and a ground voltage line, and are responsive to a row address decoded signal on one of the row address decoded signal lines DR1 to DRm for driving one of the word lines WL1 to WLm to the boosted voltage level. As describe hereinbefore, since the bootstrapping circuit 14f produces the boosted voltage signal BOV in the one-shot pulse form, the selected driver circuit also drives the associated word line in a one-shot pulse form.

The column addressing sub-system 14b comprises a column address buffer unit 14i coupled with the address pins, a column address decoder unit 14j coupled with the column address buffer unit 14i and a column selector unit 14k coupled with the column address decoder unit 14j. The column address buffer unit 14i is responsive to an internal control signal CTL5 produced in synchronism with a column address strobe signal CAS supplied from the outside thereof, and latches a column address signal indicative of one of the column addresses. The column address buffer unit 14i produces column address predecoded signals also indicative of the column address, and the column address predecoded signals are supplied to the column address decoder unit 14j. The column address decoder unit 14j discriminates the column address, and drives one of the column address decoded signal lines COL. The column selector unit 14k is implemented by a plurality pairs of n-channel enhancement type transfer transistors Qn16 and Qn17, and the plurality pairs of n-channel enhancement type transfer transistors Qn16 and Qn17 are respectively associated with the bit line pairs BLP1 to BLPn. The n-channel enhancement type transfer transistors Qn16 and Qn17 of each pair are coupled between the left and right bit lines BLa and BLb of the associated pair and a data bus BUS, and are gated by one of the column address decoded signal lines COL for coupling the associated bit line pair with the data bus BUS.

A read amplifier 15a and a write amplifier 15b are coupled in parallel with the data bus BUS, and in turn are coupled with an input and output data buffer unit 15c. Either read or write amplifier 15a or 15b is enabled with an internal control signal at an appropriate timing, and increases a potential difference indicative of a read-out data bit on the data bus BUS or a potential difference indicative of a write-in data bit supplied from the input and output data buffer unit 15c.

The input and output data buffer unit 15c is coupled between a data pin Dx and the read and write amplifiers 15a and 15b, and produces an output data signal from the potential difference indicative of the read-out data bit and the potential difference from a write-in data bit at the data pin Dx.

The controlling sub-system 14c comprises a power stabilizer 14m coupled with a power voltage pin PW and a timing generating unit 14n coupled with a plurality of external control signal pins assigned to external control signals such as a row address strobe signal RAS, a column address strobe signal CAS and a write-enable signal WE The power stabilizer 14m stabilizes a power voltage at the power voltage pin PW, and distributes the stabilized power voltage level Vcc to the component units such as the bootstrapping circuit 14f, the row address decoder unit 14e, the driver unit 12b and so forth.

The timing generating unit 14n is responsive to the row address strobe signal RAS and the column address strobe signal CAS for producing the internal control signals CTL1 to CTL5. In particular, the control signal CTL4 is produced each time when the row address strobe signal RAS is changed from the inactive high level to the active low level or from the active low level to the inactive high level. While the column address strobe signal CAS repeatedly swings between the inactive high voltage level and the active low voltage level in the presence of the row address strobe signal RAS fixed to the active low voltage level, the timing generating unit 14n also repeatedly produces the internal control signal CTL6 for a high speed page mode as will be described hereinlater.

Another external control signal such as a write enable signal WE is further supplied to the timing generating unit 14n, and decides whether to enter a readout sequence or a write-in sequence.

Description is hereinbelow made on the read-out sequence in the high speed page mode with reference to FIG. 4 on the assumption that the row address signal changes the word line selection from the word line WL2 to the word line WL1.

In order to terminate the access to the word line WL2, the row address strobe signal RAS is changed from the low level to the high level. In response thereto, the control signal CTL4 is generated to cause the bootstrapping circuit 14f to produce the boosted signal BOV. The word line WL2 is thereby energized at time t11 for restoring or refreshing data bits stored in the memory cells M21 to M2n coupled with the word line WL2. The internal control signal CTL2 rises at time t12 for canceling the potential differences on the bit line pairs BLP1 to BLPn, thereby completing the previous access.

The timing generating unit 14n is responsive to the change in logic level of the row address strobe signal RAS from the high level to the low level, and supplies the internal control signal CTL 3 to the row address buffer unit 14d. The row address signal indicative of a new row address is latched by the row address buffer unit 14d, and the row address predecoded signals are supplied from the row address buffer unit 14d to the row address decoder unit 14e. The row address decoder unit 14e discriminates the new row address, and drives the decoded signal line DR1 to the power voltage level Vcc.

While the row address signal is decoded, the timing generating unit 14n produces the internal control signal CTL4, and supplies the internal control signal CTL4 to the bootstrapping circuit 14f. The bootstrapping circuit 14 elevates the output signal line BOV to the boosted voltage level Vh.

Since the row address decoded signal line DR1 enables the driver circuit 141, the driver circuit 141 drives the word line WL1 to the boosted voltage level Vh at time t13, and the n-channel enhancement type switching transistors of the memory cells M11 to M1n concurrently turn on so as to couple the associated storage capacitors with the left bit lines BLa of the bit line pairs BLP1 to BLPn. Then, potential differences take place on the bit line pairs BLP1 to BLPn.

The timing generating unit 14n further supplies the internal control signal CTL1 to the driver unit 12b which the word line WL1 is being energized, and the driver unit 12b drives the power supply line SAP and SAN to the power voltage level Vcc and the ground voltage level, respectively. The power supply lines SAP and SAN start separating from the mid voltage level Vcc/2 at time t14, and the sense amplifier circuits SA1 to SAn are concurrently activated with the power supply lines SAP and SAN. As a result, the sense amplifier circuits SA1 to SAn start increasing the potential differences on the bit line pairs BLP1 to BLPn.

Figure 4:
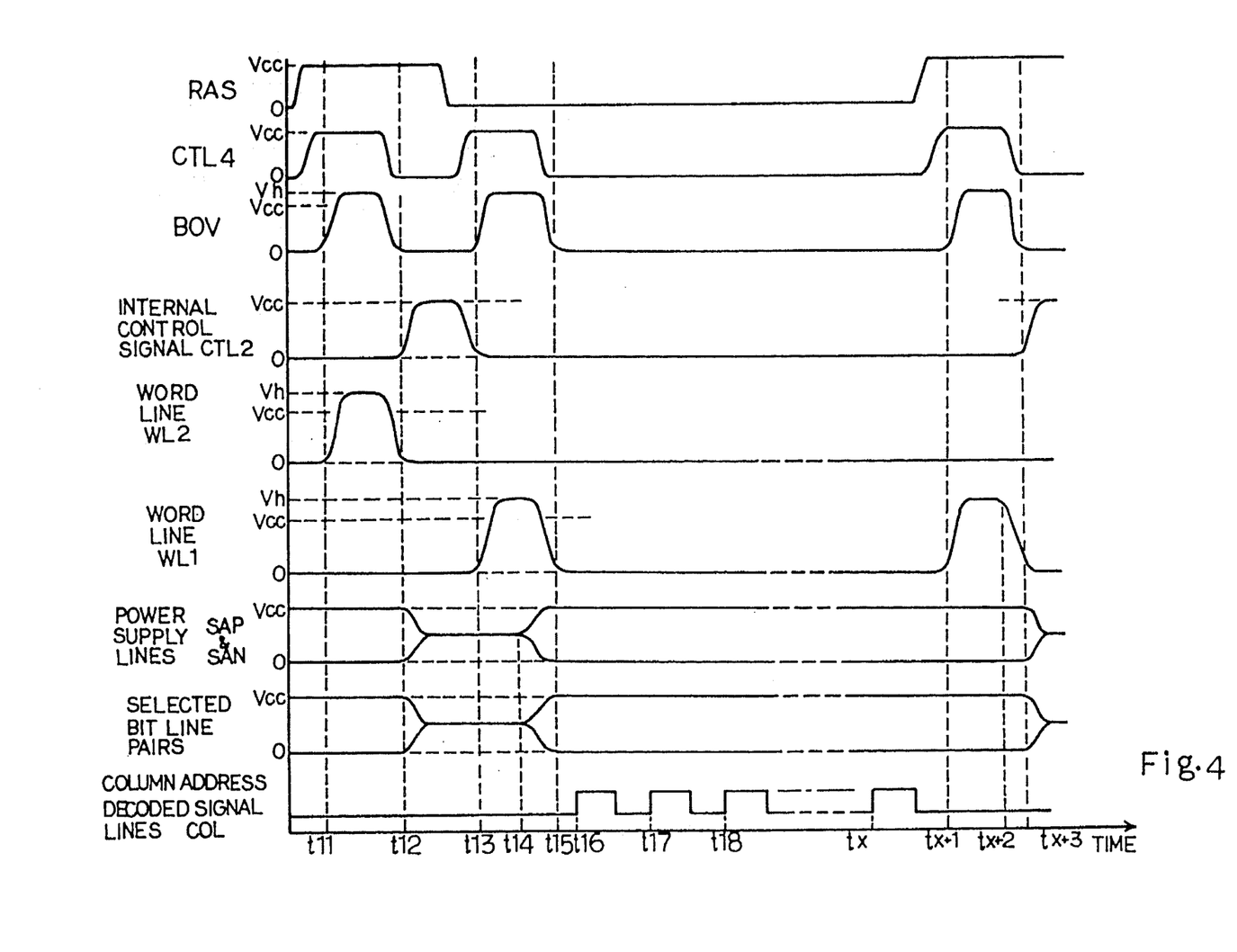
FIG. 4 is a timing chart showing a read-out sequence in a page mode carried out by the dynamic random access memory device according to the present invention.

Since each of the sense amplifiers SA1 to SAn amplifies the potential difference between the associated bit line pair BLP and hold the potential level of one of them at the power voltage level Vcc and that of the other of them at the ground level in accordance with the data stored in the associated memory cell, the word line WL1 is allowed to be changed to the ground voltage level, as shown in FIG. 4.

The column address strobe signal CAS goes down to the active low voltage level, and the timing generating unit 14n supplies the internal control signal CTL5 to the column address buffer unit 14i. The column address signal is latched by the column address buffer unit 14i, and the column address predecoded signals are supplied to the column address decoder unit 14j. The column address decoder unit 14j discriminates the column address, and drives one of the column address decoded signal lines COL at time t16. The column selector unit 14k transfers one of the potential differences from one of the sense amplifier circuits SA1 to SAn to the data bus, and the read amplifier 15a develops the potential difference indicative of the read-out data bit on the data bus BUS. Finally, the input and output data buffer unit 15c produces the output data signal.

As known in the art as a page-mode access, the column address strobe signal CAS repeatedly swings between the low voltage level and the high voltage level, and the column address signal changes the column address in synchronism therewith, while the row address strobe signal RAS is being held at the active low level. The timing generating unit 14n also repeatedly supplies the internal control signal CTL6 to the column address buffer unit 14i, and the column address stored in the column address buffer unit 14i are sequentially changed. As a result, the column address decoder unit 14j sequentially driving selected column address decoded signal lines to the power voltage level at times t17, t18, ... and tx, and the potential differences are also sequentially transferred from the sense amplifier circuits through the column selector unit 14k and the read amplifier circuit 15a to the input and output data buffer unit 15c for changing the output data signal.

When the page-mode access is completed, the row address strobe signal RAS is changed to the high level. In response thereto, the control signal CTL4 is produced again. The bootstrapping circuit 14f thereby supplies the boosted voltage level Vh to the driver circuit 141 again, and the word line WL1 is driven to the boosted voltage level Vh at time tx+1 again. The n-channel enhancement type switching transistors coupled with the word line WL1 turn on again, and the data bits indicated by the potential differences are restored in the memory cells M11 to M1n again. The refreshing operation on each memory cell is thereby performed.

The timing generating unit 14n thereafter shifts the internal control signal CTL2 to the power voltage level at time tx+3, and the bit line pairs BLP1 to BLPn are balanced at the mid voltage level Vcc/2 again for the next access.

Thus, all of the word lines Wl1 to WLm are maintained in the ground voltage level between time t15 to tx+1, and the electric power consumption is not drastically increased. For this reason, the number of potential differences transferred from the sense amplifier circuits are larger than that of the prior art. Moreover, the boosted voltage level Vh is not applied to the gate electrodes of the n-channel enhancement type switching transistors of the memory cells over the access in the page mode, and the n-channel enhancement type switching transistors are not deteriorated. As a result, the word line controlling system according to the present invention enhances the reliability of the dynamic random access memory device.

In a data write operation in the page-mode access, data to be written is sequentially supplied to the sense amplifier circuit 12 through the input/output buffer 15c, the write amplifier 15b and the column selector 14k. The potential levels of each bit line pair BPL are thereby determined in accordance with the data to be written. These data thus applied are then written into the memory cells simultaneously during the time period from $t_{x+1}$ to $t_{x+3}$.

Second Embodiment

Figure 5:
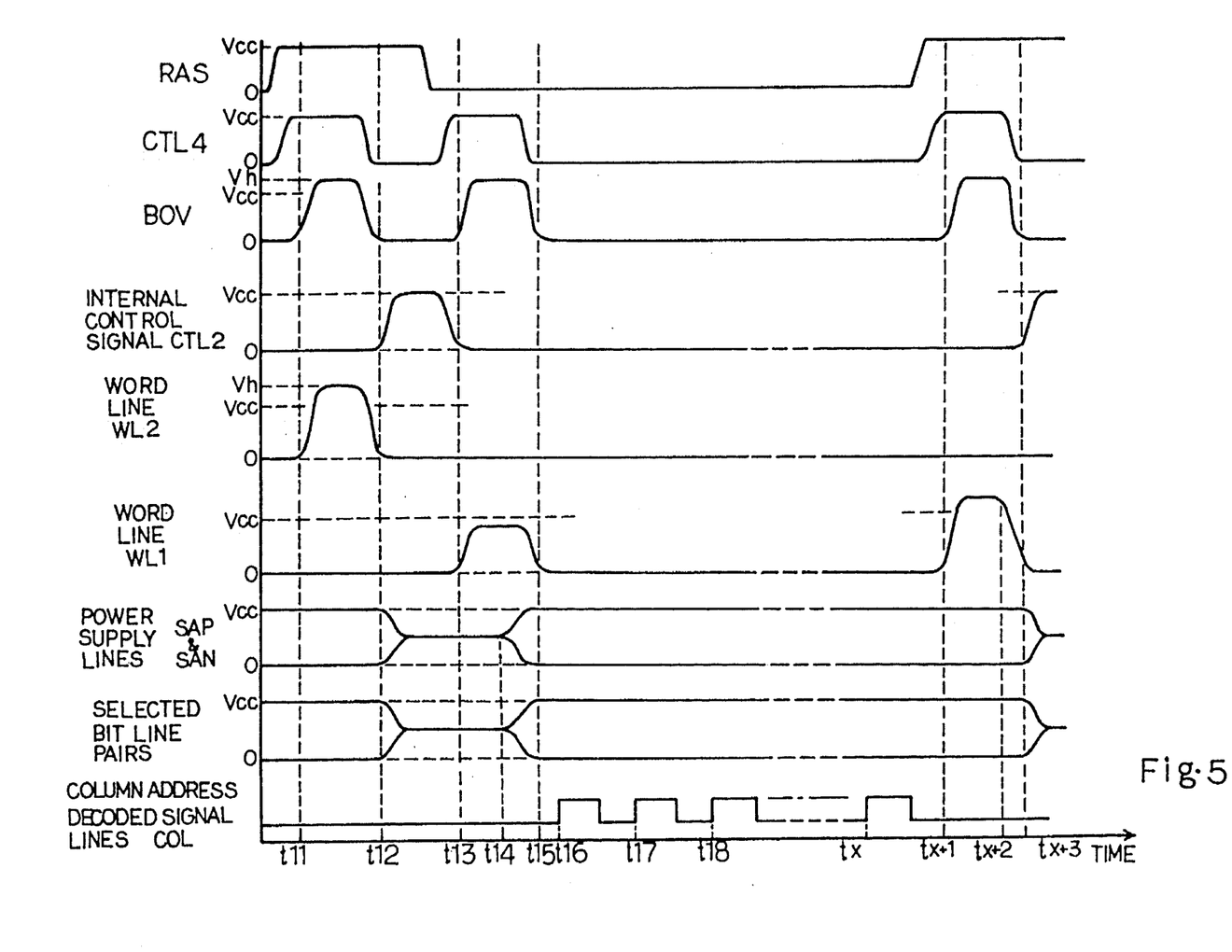
FIG. 5 is a timing chart showing a read-out sequence in a page mode carried out by another dynamic random access memory device according to the present invention.

Turning to FIG. 5 of the drawings, another dynamic random access memory device embodying the present invention traces a read-out sequence in a high speed page mode. The read-out sequence shown in FIG. 5 is different from the read-out sequence shown in FIG. 4 at the first time period, and the selected word line WL1 is driven to a predetermined voltage level lower than the power voltage level Vcc between time t13 and time t15, because only electric charge are transferred from the storage capacitors to the bit lines BLa in the first time period.

In order to provide the lower and higher voltage levels, the controlling sub-system of the second embodiment may be equipped with a voltage divider arranged in parallel to the bootstrapping circuit 14f. The voltage divider and the bootstrapping circuit may be alternately coupled with the word line driving unit 14h, thus providing the lower and the higher voltage levels respectively.

The other arrangement of the second embodiment is similar to that of the first embodiment, and no further description is hereinbelow incorporated for avoiding repetition.

Although particular embodiments of the present invention have been shown and described, it will be obvious to those skilled in the art that various changes and modifications may be made without departing from the spirit and scope of the present invention. For example, the dynamic random access memory device may form a part of an ultra large scale integration as a function block thereof, and the word line driving system according to the present invention may be available for a static column mode. Of course, the word line driving system according to the present invention is desirable for an ordinary single-bit access in view of power saving. A memory cell array incorporated in another dynamic random access memory device may be separated into a plurality of memory cell blocks accompanied with a block address decoder unit, and yet another dynamic random access memory device according to the present invention allows a multiple-bit data signal to be simultaneously read-out from and written into the memory cell array.

What is claimed is:

1. A semiconductor memory device comprising:

a plurality of word lines;

a plurality of bit lines;

a plurality of memory cells each coupled to one of said word lines and one of said bit lines;

receiving means for receiving an address strobe signal for informing an arrival of a piece of valid address information by changing its Level from an inactive level to an active level;

generating means coupled to said receiving means for generating a first one-shot pulse signal in response to a change in level of said address strobe signal from said inactive level to said active level and further generating a second one-shot pulse signal in response to a change in level of said address strobe signal from said active level to said inactive level;

address decoding means responsive to said piece of valid address information for generating a set of decoded signals for selecting one of said word lines; and energizing means responsive to said set of decoded signals and said first one-shot pulse signal for energizing one of said word lines during a first period of time defined by said first one-shot pulse signal and further responsive to said set of decoded signals and said second one-shot pulse signal for energizing said one of said word lines during a second period of time defined by said second one-shot pulse signal, said one of said word lines being energized to a first voltage level not higher than a power supply voltage during said first period of time and to a second voltage level higher than said power supply voltage during said second period of time.

* * * * *

UNITED STATES PATENT AND TRADEMARK OFFICE
CERTIFICATE OF CORRECTION

PATENT NO.    : 5,463,592
DATED         : October 31, 1995
INVENTOR(S)   : Toru ISHIKAWA It is certified that error(s) appears in the above-identified patent and that said Letters Patent is hereby corrected as shown below:

Col. 6, line 9, delete "Qn15" and insert --Qn17--.

Col. 6, line 10, delete "Qn15" and insert --Qn17--.

Signed and Sealed this

Thirtieth Day of April, 1996

Attest:

BRUCE LEHMAN

*Attesting Officer*      *Commissioner of Patents and Trademarks*